(12) United States Patent
Schaefer

(10) Patent No.: US 6,798,315 B2
(45) Date of Patent: Sep. 28, 2004

(54) LATERAL MOTION MEMS SWITCH

(75) Inventor: Timothy M. Schaefer, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 178 days.

(21) Appl. No.: 10/006,865

(22) Filed: Dec. 4, 2001

(65) Prior Publication Data

US 2003/0102936 A1 Jun. 5, 2003

(51) Int. Cl.$^7$ ................................................. H01P 1/10
(52) U.S. Cl. ....................... 333/105; 333/262; 200/244; 200/253.1
(58) Field of Search ................................. 333/101–108, 333/262; 200/244, 253.1, 329, 181; 361/78, 80, 106, 185

(56) References Cited

U.S. PATENT DOCUMENTS

| 5,025,346 A | 6/1991 | Tang et al. |
| 5,353,641 A | 10/1994 | Tang |
| 5,428,259 A | 6/1995 | Suzuki |
| 5,447,068 A | 9/1995 | Tang |
| 5,536,988 A | 7/1996 | Zhang |
| 5,554,304 A | 9/1996 | Suzuki |
| 5,578,976 A | 11/1996 | Yao |
| 5,619,061 A | 4/1997 | Goldsmith et al. |

(List continued on next page.)

FOREIGN PATENT DOCUMENTS

| EP | 0751546 | 1/1997 |
| EP | 0892419 | 1/1999 |
| WO | 99/63562 | 12/1999 |
| WO | 00/52722 | 9/2000 |
| WO | 01/01434 | 1/2001 |
| WO | 01/03152 | 1/2001 |

OTHER PUBLICATIONS

Koester et al., "MUMPS Design Handbook", Revision 6.0, pp.1–9 (2001).
Kruglick et al., "Lateral MEMS Microcontact Considerations", Journal of Microelectromechanical Systems, vol. 8 No. 3, pp. 264–271 (1999).
Muldavin et al., "Novel Series and Shunt MEMS Switch Geometries for X–Brand Applications", 30$^{th}$ European Microwave Conference—Paris, pp. 260–263 (2000).

(List continued on next page.)

*Primary Examiner*—Benny Lee
*Assistant Examiner*—Kimberly Glenn
(74) *Attorney, Agent, or Firm*—Faegre & Benson LLP

(57) ABSTRACT

A micro-electrical-mechanical system (MEMS) switch. The switch includes a compliant spring that supports a contact shuttle for movement in a lateral direction generally parallel to the substrate and biases the contact shuttle to a normally open switch state position. A plurality of moving electrodes are coupled to the contact shuttle. A plurality of fixed electrodes are interleaved with the moving electrodes. The moving electrodes and the fixed electrodes have generally planar major surfaces perpendicular to the plane of the substrate. Electrostatic forces developed between the fixed and moving electrodes cause the contact shuttle to move to a closed switch state position in response to the application of an actuation voltage. The moving direction of the moving electrodes and the contact shuttle is along a longitudinal axis parallel to the substrate and perpendicular to the planar major surfaces of the electrodes.

28 Claims, 8 Drawing Sheets

U.S. PATENT DOCUMENTS

| | | | |
|---|---|---|---|
| 5,620,931 A | | 4/1997 | Tsang et al. |
| 5,631,514 A | | 5/1997 | Garcia et al. |
| 5,638,946 A | | 6/1997 | Zavracky |
| 5,640,039 A | | 6/1997 | Chau et al. |
| 5,770,913 A | | 6/1998 | Mizzi |
| 5,804,084 A | | 9/1998 | Nasby et al. |
| 5,808,383 A | | 9/1998 | Kostov et al. |
| 5,808,527 A | | 9/1998 | De Los Santos |
| 5,834,864 A | | 11/1998 | Hesterman et al. |
| 5,847,280 A | | 12/1998 | Sherman et al. |
| 5,858,809 A | | 1/1999 | Chau et al. |
| 5,990,615 A | * | 11/1999 | Sakaguchi et al. .......... 313/504 |
| 5,994,796 A | | 11/1999 | De Los Santos |
| 6,020,564 A | | 2/2000 | Wang et al. |
| 6,046,659 A | | 4/2000 | Loo et al. |
| 6,057,520 A | | 5/2000 | Goodwin-Johansson |
| 6,069,540 A | | 5/2000 | Berenz et al. |
| 6,133,670 A | | 10/2000 | Rodgers et al. |
| 6,143,997 A | | 11/2000 | Feng et al. |
| 6,153,839 A | | 11/2000 | Zavracky et al. |
| 6,160,230 A | | 12/2000 | McMillan et al. |
| 6,218,911 B1 | * | 4/2001 | Kong et al. ................. 333/101 |
| 6,229,683 B1 | | 5/2001 | Goodwin-Johansson |
| 6,428,173 B1 | * | 8/2002 | Dhuler et al. ............... 359/872 |
| 6,506,989 B2 | * | 1/2003 | Wang .......................... 200/181 |
| 2002/0190267 A1 | * | 12/2002 | Robertson ................... 257/130 |

OTHER PUBLICATIONS

Rizk et al., "Design of X–Band MEMS Microstrip Shunt Switches" 30$^{th}$ European Microwave Conference—Paris, pp. 20–23 (2000).

Schaffner et al., "RF MEMS Switches for Tunable Filters and Antennas (Invited)" Micro Opto Electro Mechanical Systems—MOEMS, pp. 244–249 (1999).

Raun et al., "Latching Micro Electromagnetic Relays" Solid–State Sensor and Actuator Workshop Technical Digest, pp. 146–149 (2000).

Duffy et al., "MEMS Microswitches for Reconfigurable Microwave Circuitry", IEEE Microwave and Wireless Components Letters, vol. 11, No. 3, pp. 106–108 (2001).

Mihailovich et al., "MEM Relay of Reconfigurable RF Circuits" IEEE Microwave and Wireless Components Letters, vol. 11, No. 2, pp. 53–55 (2001).

Hyman et al., "Surface–Micromachined RF MEMs Switches on GaAs Substrates" John Wiley & Sons, Inc. Int J RF and Microwave CAE9, pp. 348–361 (1999).

Rizk et al., "High–Isolation W–Band MEMS Switches", IEEE Microwave and Wirelss Components Letters, vol. 11, No. 1, pp. 10–12 (2001).

Ponchak et al., "Microelectomechanical Switches for Phased Array Antennas" IEEE Antennas and Propagation Society International Symposium, vol. 4, pp. 2230–2233 (2000).

Tang et al., "Laterally Driven Polysilicon Resonant Microstructures," *Sensors and Actuators*, vol. 20, pp. 25–32, 1989.

Tang, "Electrostatic Comb Drive for Resonant Sensor and Actuator Applications," Ph.D. dissertation for University of California at Berkeley, 1990.

Hirano, et al. "Design, Fabrication and Operation of Submicron Gap Comb–Drive Microactuators," *IEEE Journal of Microelectromechanical Systems*, vol. 1, pp. 52–59, Mar. 1992.*

Jaecklin, et al., "Comb Actuators for XY–Microstages," *Sensors and Actuators A*, vol. 39, pp. 89–89, 1993.*

Legtenberg, et al. "Comb–Drive Actuators for Large Displacements," *Journal of Micromechanics and Microengineering*, vol. 6, pp. 320–329, 1996.*

* cited by examiner

US 6,798,315 B2

LATERAL MOTION MEMS SWITCH

GOVERNMENT RIGHTS

The United States government has certain rights in this invention pursuant to Grant No. N66001-99-C-8605, Defense Advanced Research Project A.

FIELD OF THE INVENTION

The present invention is a micro-electrical-mechanical system (MEMS) switch.

BACKGROUND OF THE INVENTION

Micro-electrical-mechanical system (MEMS) switches are well known and disclosed, for example, in the following U.S. Patents.

| Inventor | Patent No. |
| --- | --- |
| Yao | 5,578,976 |
| Goldsmith et al. | 5,619,061 |
| Zavracky | 5,638,946 |
| De Los Santos | 5,808,527 |
| De Los Santos | 5,994,796 |
| Wang et al. | 6,020,564 |
| Loo et al. | 6,046,659 |
| Berenz et al. | 6,069,540 |
| Feng et al. | 6,143,997 |
| Zavracky | 6,153,839 |
| McMillan et al. | 6,160,230 |
| Goodwin-Johansson | 6,229,683 |

These switches are typically configured as a cantilever or suspended mass structure and have a switch contact that moves in a generally perpendicular direction with respect to the plane of the substrate on which the device is fabricated. Unfortunately, the frequency response of these "vertically" actuated switches is insufficient for certain applications. The polysilicon-to-polysilicon electrical contacts of these switches often exhibit relatively high resistance due to oxidation of the opposing silicon surfaces.

Still other MEMS actuators include electrostatic combs having a plurality of electrodes. For example, U.S. Pat. No. 6,133,670 discloses an electrostatic comb actuator having a fixed comb electrode and a moving comb electrode supported by a spring. Both the fixed and moving comb electrodes have a plurality of elongated fingers arranged generally parallel to one another at spaced-apart positions. In a rest position with no electric actuation voltage, the fingers of the fixed comb electrode are partially meshed (i.e. interdigitated to a predetermined extent) with the fingers of the moving comb electrode. In response to an electric actuation voltage, forces move the moving comb towards the fixed comb in a direction parallel with a longitudinal axis of the electrode fingers against the restoring force of the spring. MEMS devices of this type require a relatively high actuation voltage to operate the moving electrodes.

Therefore, there remains a continuing need for improved MEMS switches. In particular, there is a need for relatively high-frequency, low-noise MEMS switches. Switches of these types that have a relatively low actuation voltage would be especially desirable.

SUMMARY OF THE INVENTION

The present invention is a MEMS switch that can be configured for high-frequency, low actuation voltage, low noise and low contact resistance operation. One embodiment of the invention includes a substrate defining a plane, first and second switch contacts and a contact shuttle that is movable in a linear path parallel to the plane of the substrate between first and second switch state positions with respect to the switch contacts. A spring biases the contact shuttle to the first switch state position. A plurality of moving electrodes are coupled to the contact shuttle and have generally planar major surfaces perpendicular to the plane of the substrate. A plurality of fixed electrodes, each located interleaved with and adjacent to one of the moving electrodes, have generally planar major surfaces perpendicular to the plane of the substrate. In response to the application of an electric actuation voltage, electrostatic forces develop between the moving and fixed electrodes causing the moving electrodes to move along an axis parallel to the plane of the substrate and perpendicular to the planar major surfaces of the electrodes, thereby forcing the contact shuttle to move to the second switch state position.

Another embodiment of the switch includes a substrate and a contact shuttle movable with respect to the substrate between switch state positions. A plurality of moving electrodes are coupled to the contact shuttle at spaced-apart locations and have generally planar major surfaces facing each other to form a comb structure. A plurality of fixed electrodes are coupled to the substrate at spaced-apart locations and have generally planar major surfaces facing each other to form a comb structure. The fixed electrode comb structure is interleaved with the moving electrode comb structure. In response to the application of an electric actuation voltage, electrostatic forces develop between the moving and fixed electrodes causing the major surfaces of the moving electrodes to move with respect to the major surfaces of the fixed electrodes, thereby forcing the contact shuttle to move between the switch state positions along a longitudinal axis parallel to the substrate and perpendicular to the planar major surfaces of the electrodes.

Yet another embodiment of the switch includes a driven member and a contact shuttle connected to the driven member. The contact shuttle is movable between switch state positions with respect to the switch contacts. An oxide insulator electrically isolates the contact shuttle and the driven member.

DETAILED DESCRIPTION OF THE PREFERRED EMBODIMENTS

Figure 1:
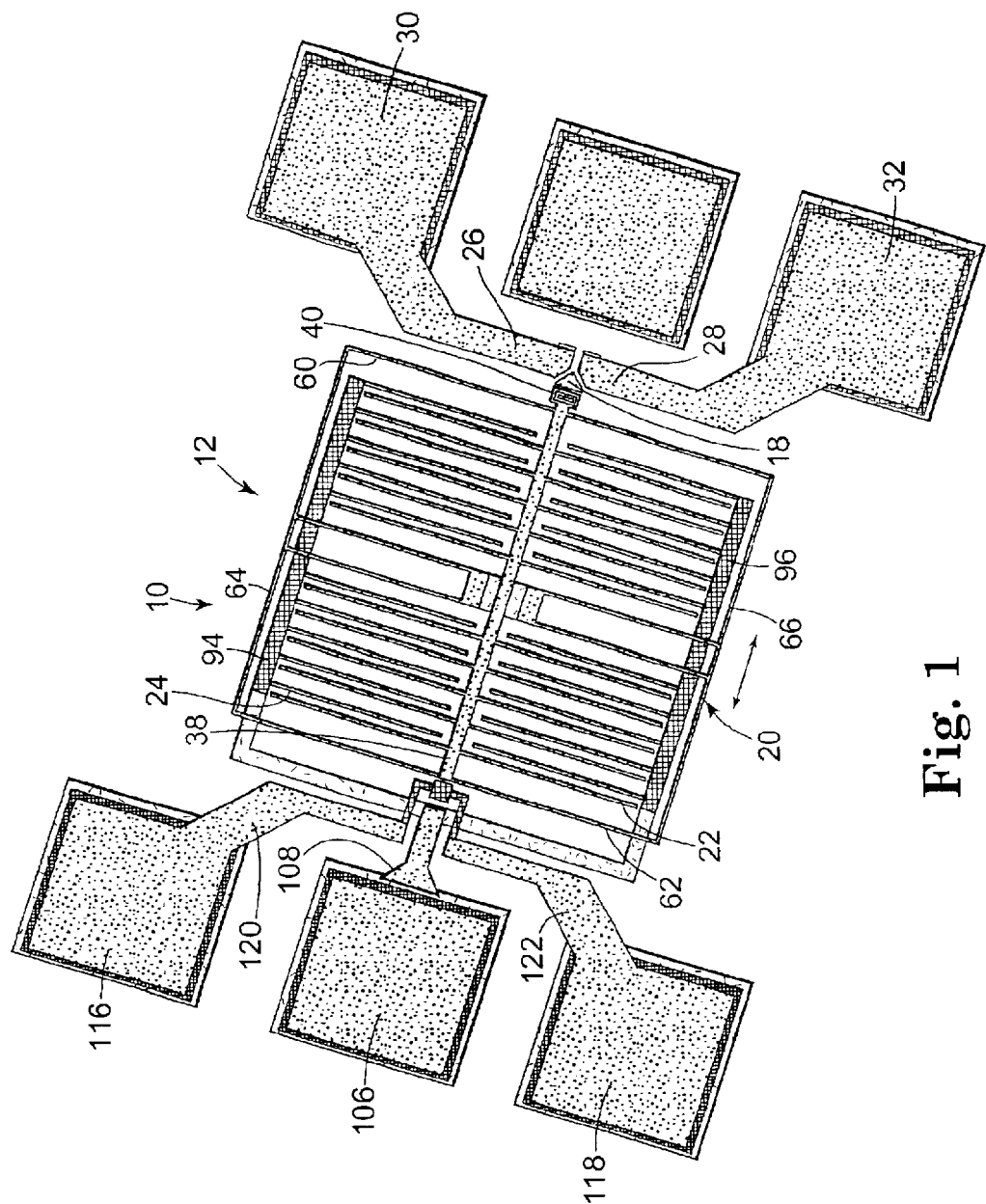
FIG. 1 is a top plan view of one embodiment of a MEMS switch in accordance with the invention.
Figure 2:
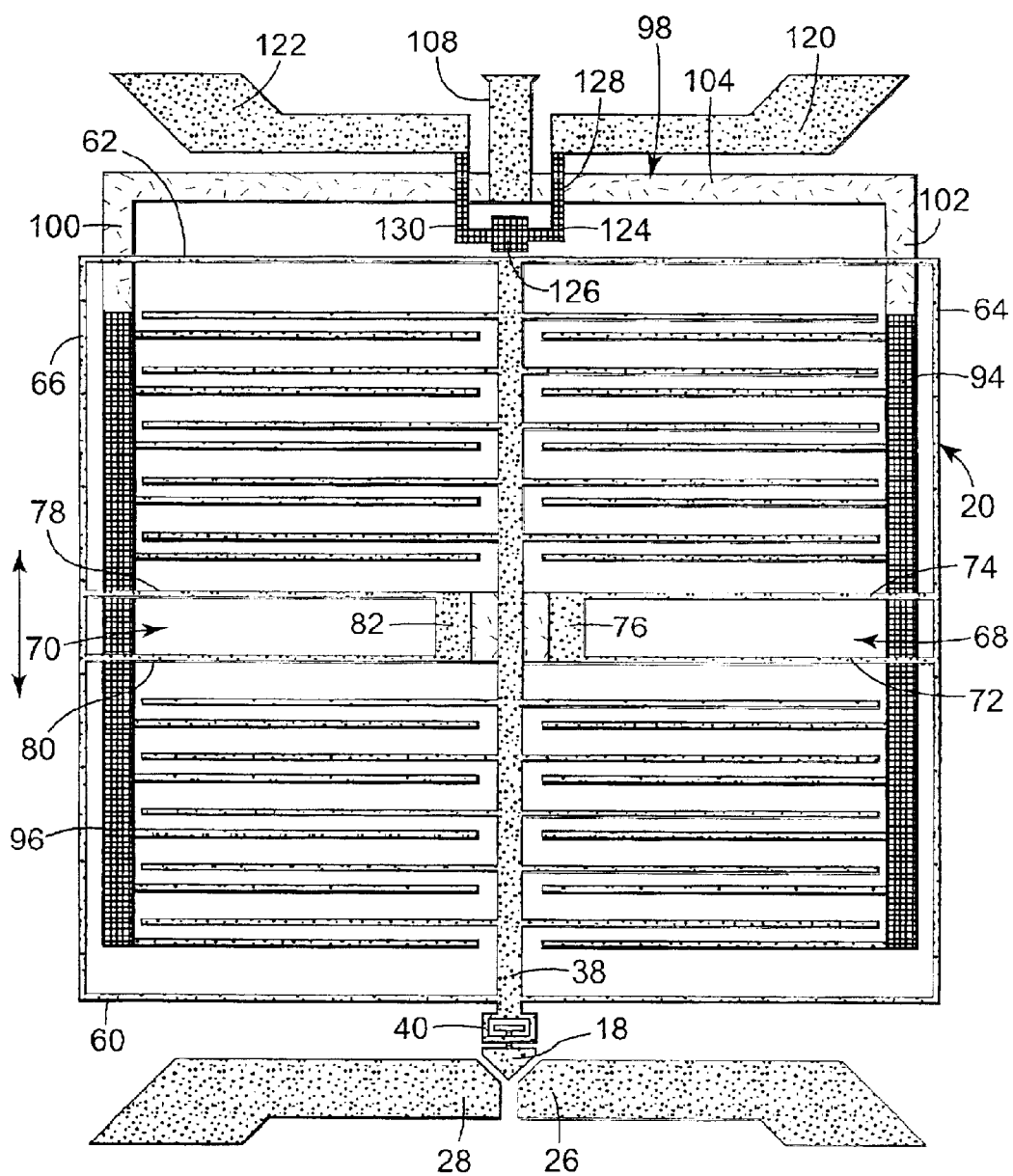
FIG. 2 is a detailed top plan view of the MEMS switch shown in FIG. 1.
Figure 3:
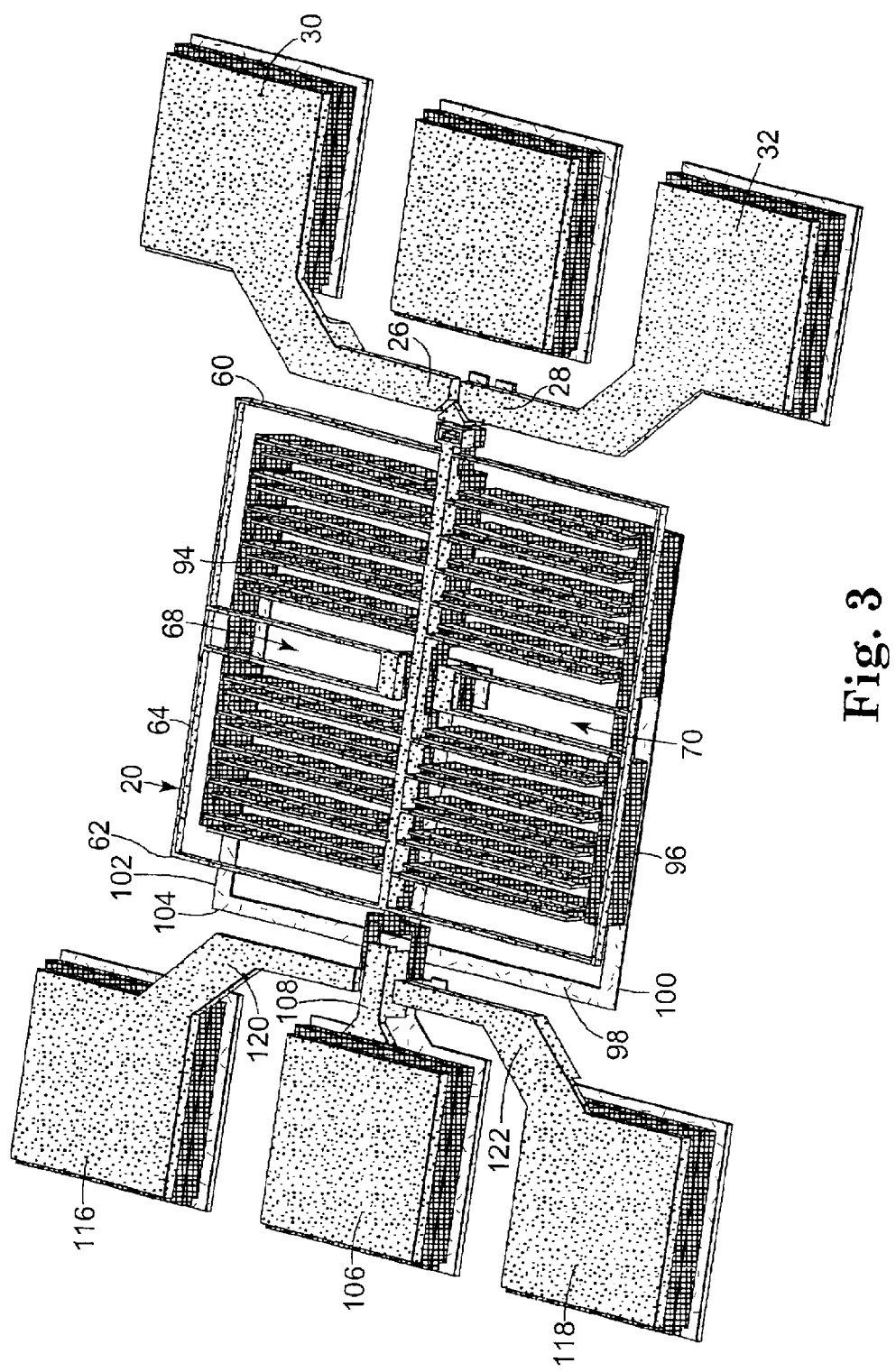
FIG. 3 is a top isometric view of the MEMS switch shown in FIG. 1.

A lateral motion micro-electrical-mechanical system (MEMS) switch 10 in accordance with one embodiment of the present invention is illustrated in FIGS. 1–8. As shown, switch 10 is formed on a substrate 12 and includes first and second switch contacts 14 and 16, respectively, contact shuttle 18 and spring 20. The contact shuttle 18 is movable in a linear path between electrically open and electrically closed (i.e., first and second) switch state positions with respect to the switch contacts 14 and 16. The linear path in which the contact shuttle moves is generally parallel to the plane of the substrate 12 (i.e., lateral motion). In the embodiment shown, the spring 20 biases the contact shuttle 18 to the open switch state position. A plurality of moving electrodes 22 are coupled to the contact shuttle 18. A plurality of fixed electrodes 24, each located adjacent to one of the moving electrodes 22, are interleaved with the moving electrodes. The moving electrodes 22 and the fixed electrodes 24 have generally planar major surfaces perpendicular to the plane of the substrate 12. In response to the application of an actuation voltage, electrostatic forces develop between the moving electrodes 22 and the fixed electrodes 24 causing the moving electrodes 22 to move along an axis parallel to the plane of the substrate 12 and perpendicular to the planar major surfaces of the moving electrodes 22 and the fixed electrodes 24, thereby forcing the contact shuttle 18 to move to the closed switch state position against the bias force of the spring 20. When the actuation voltage is removed, the spring 20 returns the contact shuttle to its open switch state position. The linear path in which the contact shuttle moves is generally parallel to the plane of the substrate 12. In the embodiment shown, the linear path of the contact shuttle is also along a longitudinal axis that is perpendicular to the planar major surfaces of the moving electrodes 22 and the fixed electrodes 24.

Prototypes of the embodiment of the switch 10 described herein are configured for fabrication on silicon dies using the MUMPs three-layer polysilicon surface deposition and micromachining process described in the MUMPs Design Handbook, Revision 6.0, ©2001 by Cronos Integrated Microsystems of Research Triangle Park, N.C., which is hereby incorporated by reference. Briefly, the MUMPs process specifies the fabrication of MEMS devices such as switch 10 on a silicon substrate from one or more of up to three separately deposited layers of polysilicon used as the structural material (i.e., a first or poly 0 layer, a second or poly 1 layer, and a third or poly 2 layer). Phosphosilicate glass oxide (PSG) is used as the sacrificial layer. Silicon nitride is used as the electrical isolation between the polysilicon and the substrate. Each of the first, second and/or third polysilicon layers forming a portion of the elements of the embodiment of switch 10 described herein is separately described and illustrated in the drawing figures. In particular, portions of a structure formed from the first polysilicon layer are indicated by line shading, portions of a structure formed from the second polysilicon layer are indicated by cross-hatching, and portions or a structure formed from the third polysilicon layer are indicated by speckled shading. Prototype devices in accordance with the invention sizes in the range of 200×200 microns. However, it is anticipated that the sizes of the devices can be decreased to the range of 35×35 microns and lower.

The first switch contact 14 is an end face of a switch output lead 26. Similarly, second switch contact 16 is an end face of a switch input lead 28. The ends of leads 26 and 28, opposite contacts 14 and 16, terminate at terminal pads 30 and 32, respectively. In the embodiment shown, the faces of contacts 14 and 16 are planar, and positioned adjacent to (but are electrically isolated from) one another to form a generally V-shaped gap that opens toward the contact shuttle 18. The faces of contacts 14 and 16 are preferably coated with a gold or other metal layer to enhance their electrical characteristics. Switch contacts 14 and 16 are formed from the first, second and third polysilicon layers. Although the embodiment of the invention described and illustrated above has a V-shaped gap, other concave or generally opening shapes such as a U-shaped or a bowl-shaped gap will provide a similar functionality.

In the illustrated embodiment, contact shuttle 18 is a triangularly-shaped member that is sized and shaped to extend into the gap between the contacts 14 and 16 of the respective switch leads 26 and 28. This embodiment of the contact shuttle 18 has a pair of generally planar contact faces 34 and 36 that are configured to engage switch contacts 14 and 16, respectively, when the shuttle is in its closed switch state position. The faces 34 and 36 of the shuttle 18 are coated with a gold or other metal layer in preferred embodiments to enhance their electrical interconnection to the switch contacts 14 and 16 when the shuttle is in the closed switch state position. When the contact shuttle 18 is in the electrically open position, its contact faces 34 and 36 are disengaged from the switch contacts 14 and 16, thereby causing the output lead 26 to be electrically isolated from the input lead 28. The contact shuttle 18 is formed from the second and third polysilicon layers in the embodiment shown. A convex dimple (not shown) formed from the second polysilicon layer extends downwardly from the surface of the contact shuttle 18 facing the substrate 12. Although the embodiment of the invention described and illustrated above has a contact shuttle and switch contacts with planar, V-shaped and vertically-oriented contact faces, it is to be understood that the invention is not so limited, and that these features of the invention can be provided with other configurations such as concave or generally opening shapes to provide the electrical switching functions.

Figure 4:
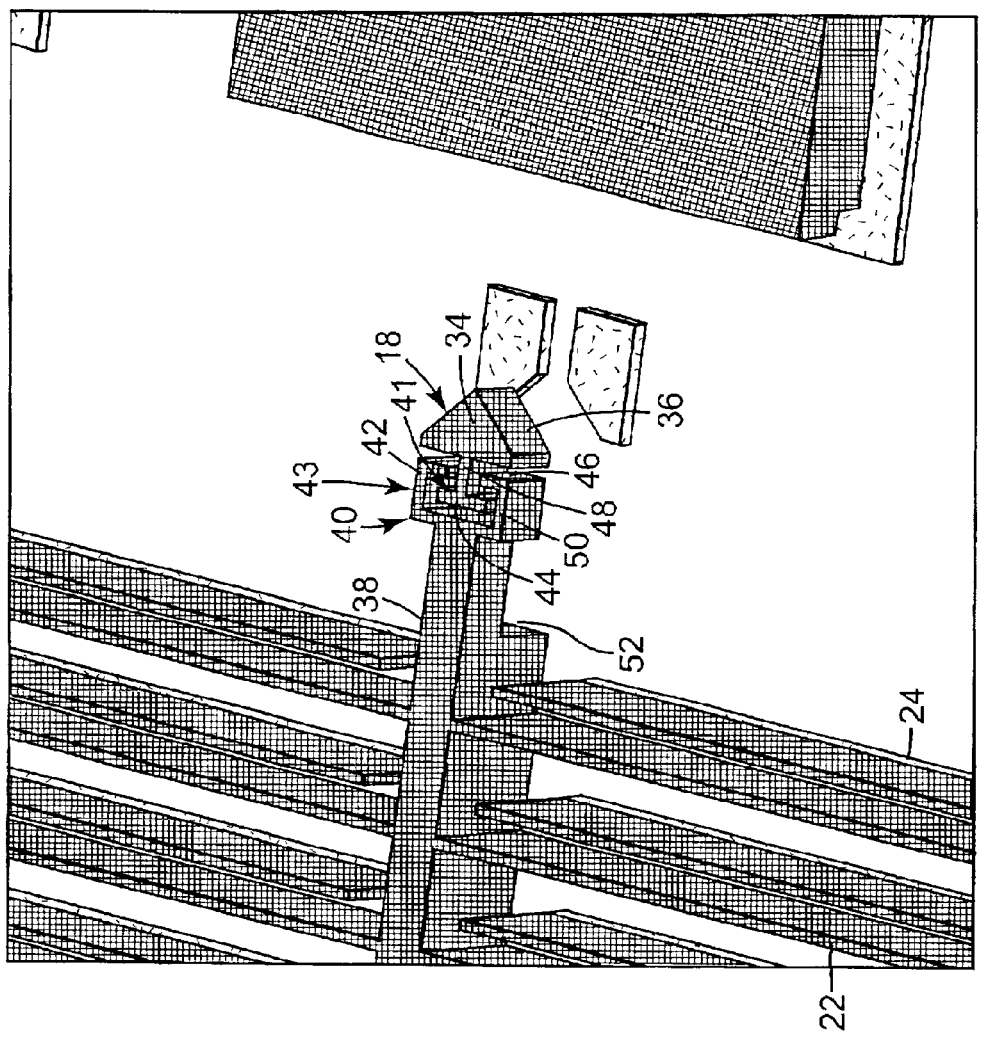
FIG. 4 is a detailed top isometric view of the first and second polysilicon layers of the contact shuttle shown in FIG. 1.

The contact shuttle 18 is connected to the end of a rigid member 38 by an isolation mount 40. The rigid member 38 is elongated along the longitudinal axis that is parallel to the plane of the substrate 12 and perpendicular to the planar major surfaces of the moving electrodes 22 and the fixed electrodes 24. The rigid member 38 is formed from the second and third polysilicon layers in the embodiment shown. The isolation mount 40 includes a shuttle-engaging member 41 and a retainer member 43. As perhaps best shown in FIG. 4, the portion of the retainer member 43 formed in the second polysilicon layer includes an open or C-shaped member 42 that is attached to the rigid member 38, while the portion of the shuttle-engaging member 41 formed in the second polysilicon layer includes a T-shaped member 44 that is attached to the contact shuttle 18. The opening 46 of member 42 extends toward the contact shuttle 18. The base portion 48 of T-shaped member 44 extends through the opening 46 in C-shaped member 42 and is connected at its end to the contact shuttle 18. The top portion 50 of T-shaped member 44 is located within the C-shaped member 42. As is shown in FIG. 4, the portions of mount 40 and contact shuttle 18 in the second polysilicon layer are formed with an undercut 52 so as to leave a gap between these structures and the substrate 12.

Figure 5:
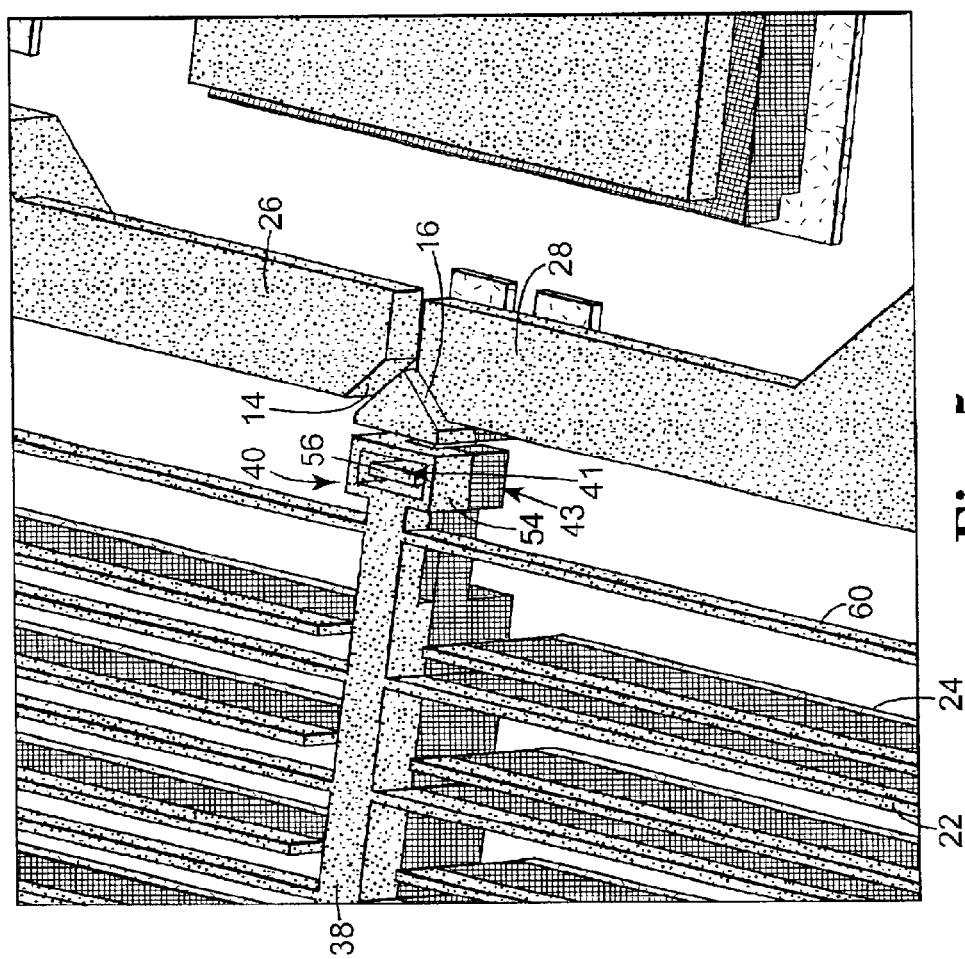
FIG. 5 is a detailed top isometric view of the first, second and third polysilicon layers of the contact shuttle shown in FIG. 1.
Figure 6:
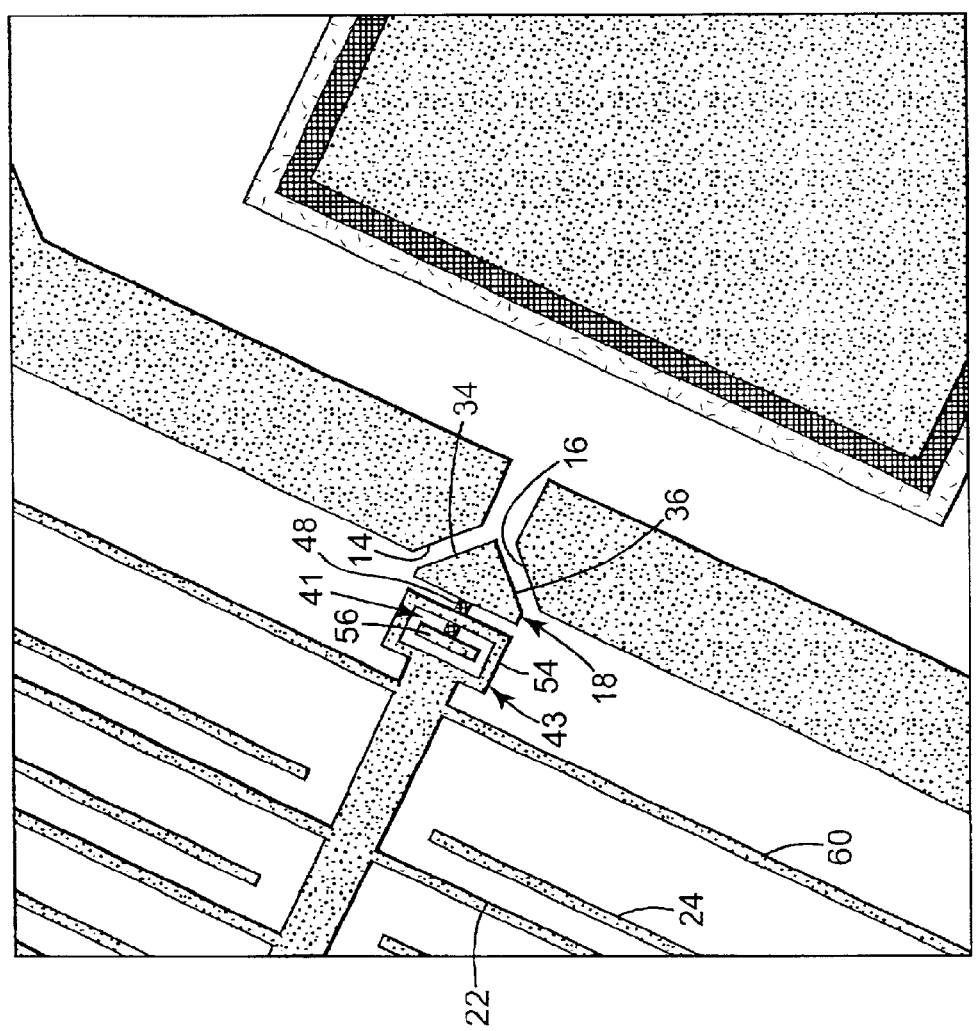
FIG. 6 is a detailed top plan view of the contact shuttle shown in FIG. 1.

As shown in FIG. 5, the portion of the retainer member 43 formed in the third polysilicon layer includes a closed or D-shaped member 54, while the portion of the shuttle-engaging member 41 formed in the third polysilicon layer includes an engaging member 56. The D-shaped member 54 has a shape matching that of the C-shaped member 42, and is located on the C-shaped member. As shown in FIG. 5, the D-shaped member 54 extends over both the opening 46 in the C-shaped member 42 and the base portion 48 of the T-shaped member 44. However, the portion of the D-shaped member 54 that extends over the base portion 48 of the T-shaped member 44 is not fixedly connected to the base portion of the T-shaped member. Engaging member 56 is located within the D-shaped member 54, on top of and fixedly attached to the top portion 50 of the T-shaped member 44.

The contact shuttle 18 and shuttle-engaging member 41 are free from fixed engagement with the retainer member 43. As a result, after the formation of the undercut 52 below these structures, the contact shuttle 18 and shuttle-engaging member 41 are free to drop into the area of the undercut 52. When the contact shuttle 18 and shuttle-engaging member 41 are in the area of undercut 52, the dimple (not shown) extending from the contact shuttle will engage the surface of the substrate 12 while the engaging member 56 of the shuttle-engaging member 41 is still retained within the C-shaped member 42. During fabrication of the contact shuttle 18 and isolation mount 40, a natural silicon oxide is allowed to form on the non-metalized surfaces of the shuttle and mount. This oxide is an insulator, and electrically isolates the contact shuttle 18 from the elements of switch 10 other than switch contacts 14 and 16.

Spring 20 is a generally rectangular member in the embodiment shown, and includes first and second end members 60 and 62, first and second side members 64 and 66, and first and second support arms 68 and 70, respectively. Spring members 60, 62, 64, 66, 68 and 70 are all formed from the third polysilicon layer in the embodiment shown. The end of the rigid member 38 adjacent to isolation mount 40 is connected to the center of the first end member 60, while the opposite end of the rigid member is connected to the center of the second end member 62. Support arm 68 includes a pair of members 72 and 74 that have a first end connected near the center of the first side member 64, and a second end connected to a first anchor 76. Similarly, support arm 70 includes a pair of members 78 and 80 that have a first end connected near the center of the second side member 66, and a second end connected to a second anchor 82. As perhaps best shown in FIG. 7, anchors 76 and 82 are formed from the first, second and third polysilicon layers and support the spring 20, as well as the rigid member 38 and isolation mount 40 mounted thereto, above the substrate 12. The spring 20 is formed in such a manner as to have sufficient compliance to allow the contact shuttle 18 to be driven to the closed switch state position when the switch 10 is electrically actuated, and to return the contact shuttle to the open switch state position when the switch is not actuated. The parallelogram-type structure of the illustrated embodiment of spring 20 offers a number of advantages (e.g., symmetrical, non-binding forces for linear movement of the rigid member 38), but other (e.g., asymmetrical) configurations of the spring are also contemplated by the invention. Furthermore, although the illustrated embodiment of the spring 20 is generally coplanar with the rigid member 38 and the motion path of the contact shuttle 18, the function of the spring can be provided by other structural configurations.

The moving electrodes 22 are fixedly attached to the opposite sides of the rigid member 38. The moving electrodes 22 are generally planar members formed from the second and third polysilicon layers and have major surfaces that are perpendicular to the substrate 12. The moving electrodes 22 effectively form a comb structure that is movable along the longitudinal axis that is parallel to the plane of the substrate and perpendicular to the planar major surfaces of the moving electrodes 22 and the fixed electrodes 24, but constrained by the spring 20. Although the illustrated embodiment of the switch 10 has ten moving electrodes 22 extending in a perpendicular direction from each side of the rigid member 38, other quantities and configurations of electrodes are contemplated by the invention.

The fixed electrodes 24 are interleaved with, and positioned adjacent to, the moving electrodes 22. The fixed electrodes 24 are generally planar members formed from the second and third polysilicon layers in the embodiment shown, and have major surfaces that are generally parallel to, but spaced apart from, the major surfaces of the associated moving electrodes 22. The fixed electrodes 24 effectively form a comb structure that is fixed to the substrate 12 and interleaved with the structure of the moving electrodes 22. The fixed electrodes 24 are fixedly attached to and extend from first and second support members 94 and 96. The support members 94 and 96 are formed from the second polysilicon layer, and are located opposite the moving electrodes 22 from the rigid member 38 in the embodiment shown. However, other structures for supporting the fixed electrodes 24 are contemplated by the invention.

Electrical interconnection to the fixed electrodes 24 is provided by a fixed electrode lead 98 that includes sections 100, 102 and 104. Lead sections 100, 102 and 104 are all formed from the first polysilicon layer in the embodiment shown. Lead sections 100 and 102 extend under the fixed electrode support members 96 and 94, respectively, and have their ends interconnected by lead section 104. A fixed electrode terminal pad 106 is connected to the generally central portion of lead section 104 by a lead section 108. The terminal pad 106 and lead section 108 are formed from the first, second and third polysilicon layers in the embodiment shown. The illustrated embodiment of fixed electrode lead 98 and its interconnection to the terminal pad 106 by the lead section 108 provides a relatively even distribution of electrical energy to all the fixed electrodes 24. However, other configurations of the fixed electrode lead 98 are contemplated by the invention.

Figure 7:
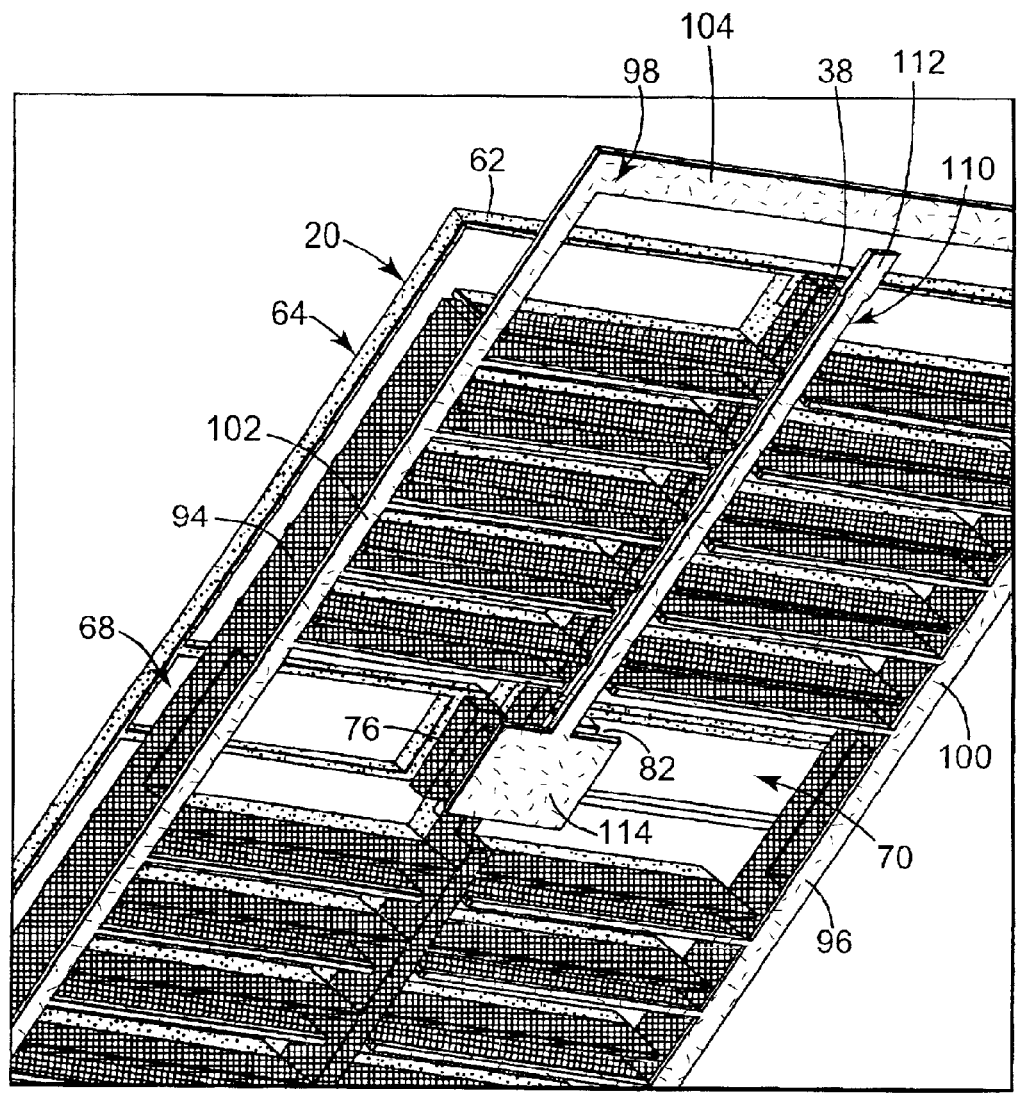
FIG. 7 is a detailed bottom isometric view of the MEMS switch shown in FIG. 1.
Figure 8:
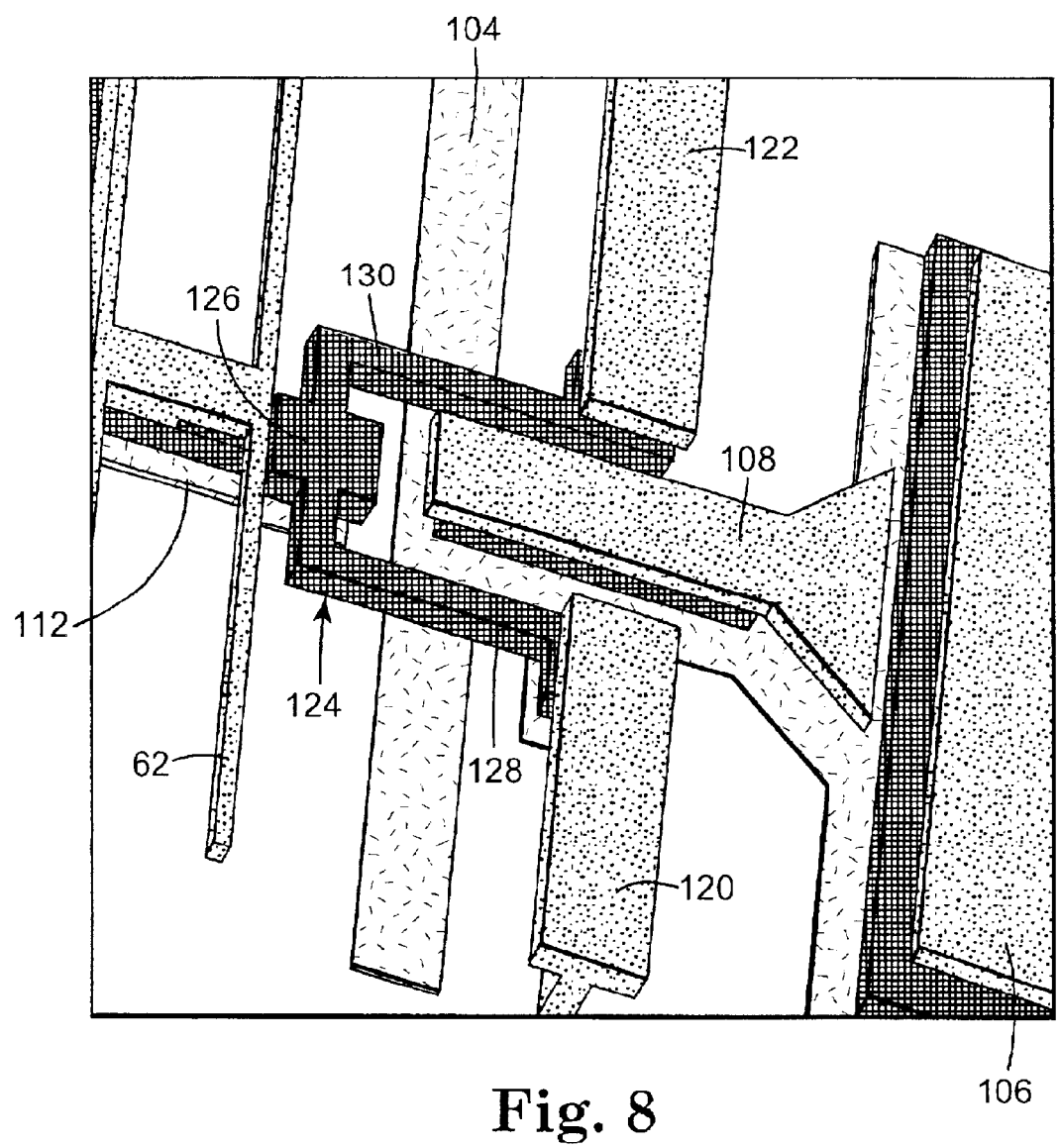
FIG. 8 is a detailed top isometric view of the lead sections connecting terminal pads to the moving electrodes and fixed electrodes.

As perhaps best shown in FIG. 7, electrical interconnection to the moving electrodes 22 is provided by a moving electrode lead 110 that includes sections 112 and 114. Lead sections 112 and 114 are all formed from the first polysilicon layer in the embodiment shown. Lead section 114 is located below both the anchors 76 and 82. Lead section 112 extends under the rigid member 38 from the section 114 to a location beyond the perimeter of spring 20. As shown for example in FIGS. 2 and 8, a pair of moving electrode terminal pads 116 and 118 and associated leads 120 and 122, respectively, are connected to the end of lead section 112 by a lead section 124. Terminal pads 116 and 118 and leads 120 and 122 are formed from the first, second and third polysilicon layers. Lead section 124 includes a post section 126 and a pair of arm sections 128 and 130. The post section 126 is formed from the first and second polysilicon layers and extends away from the substrate 12 from the end of lead section 112. The arm sections 128 and 130 are formed from the second polysilicon layer and extend from the post section 126 to the leads 120 and 122, respectively, over (and electrically isolated from) the fixed electrode lead section 104. The illustrated embodiment of moving electrode lead 110 and its electrical interconnection to one or more terminal pads such as 116 and 118 provides a relatively even distribution of electrical energy to all the moving electrodes 22. However, other configurations of the moving electrode lead 110 are also contemplated by the invention.

To operate MEMS switch 10, an electric potential is generated between the fixed electrodes 24 and the moving electrodes 22 by applying an actuation voltage across the fixed electrode terminal pad 106 and the moving electrode terminal pads 108. Fixed electrode terminal pad 106 is at ground potential in one embodiment of the invention. The electric potential generates an electrostatic force that moves the moving electrodes 22 along the longitudinal axis that is parallel to the plane of the substrate and perpendicular to the planar major surfaces of the moving electrodes 22 and the fixed electrodes 24 toward the fixed electrodes 24 against the bias force of spring 20, thereby forcing the contact shuttle 18 into the electrically closed switch state position. The electrostatic force results from the capacitance between associated fixed electrodes 24 and moving electrodes 22. When the actuation voltage applied across the terminal pads 106 and 108 is terminated, the bias force of spring 20 will return the contact shuttle 18 to its electrically open switch state position. Although the illustrated embodiment of switch 10 is a normally-open switch, the switch can of course be configured as a normally-closed device.

MEMS switches in accordance with the present invention offer a number of important advantages. The metal-to-metal contacts between the shuttle and switch contacts reduce oxidation that can build up on polysilicon surfaces, and help maintain continued low contact resistance of the switch. It can be configured in any of a number of configurations, including single pole, single throw and single pole, multiple throw. The isolation mount and the use of the natural oxide electrically isolate the contact mass from the actuation structure, thereby substantially reducing stray parasitic capacitance. The free-floating mass design of the spring and contact mass and the face-to-face orientation of the electrodes provide for a relatively low actuation voltage (less than 3 Vdc in some embodiments). The V-shaped nature of the contact structure allows self-alignment and contact scrubbing. The lateral mode (with respect to the substrate) operation of the switch allows forced operation for opening and/or closing of the switch. Contact surfaces that have become cold welded or fused together can be "unstuck." The devices provide fast actuation speed (less than 10 microseconds in some embodiments) and good frequency performance (up to 25 GHz in some embodiments). The intrinsic noise generated by these switches has been determined to be several orders of magnitude lower than transistor-based switches. Furthermore, although the illustrated embodiment of the contact shuttle moves only in one axis, the invention can be configured for movement in two or more axes generally parallel to the substrate. Embodiments capable of motion about an axis out of a plane parallel to the substrate are also contemplated.

Although the present invention has been described with reference to preferred embodiments, those skilled in the art will recognize that changes can be made in form and detail without departing from the spirit and scope of the invention.

What is claimed is:

1. A MEMS switch comprising:
   a substrate defining a plane;
   first and second switch contacts;
   a contact shuttle that is movable in a linear path between first and second switch state positions with respect to the switch contacts;
   a spring biasing the contact shuttle to the first switch state position;
   a plurality of moving electrodes coupled to the contact shuttle and having generally planar major surfaces perpendicular to the plane of the substrate; and
   a plurality of fixed electrodes, each located interleaved with and adjacent to one of the moving electrodes, having generally planar major surfaces perpendicular to the plane of the substrate, wherein in response to the application of an electric actuation voltage, electrostatic forces develop between the moving and fixed electrodes causing the moving electrodes to move along an axis parallel to the plane of the substrate and perpendicular to the planar major surfaces of the electrodes, thereby forcing the contact shuttle to move to the second switch state position along the axis parallel to the plane of the substrate and perpendicular to the planar major surfaces of the electrodes.

2. The MEMS switch of claim 1 wherein the contact shuttle is electrically isolated from the moving and fixed electrodes.

3. The MEMS switch of claim 2 wherein the contact shuttle includes:
   a polysilicon base;
   a metal contact member on the base; and
   native oxide between the base and metal contact member.

4. The MEMS switch of claim 1 wherein the spring includes:
   a relatively rigid member connected to the contact shuttle; and
   at least one resilient member connected to the relatively rigid member.

5. The MEMS switch of claim 4 wherein the moving electrodes are connected to and extend from the relatively rigid member of the spring.

6. The MEMS switch of claim 5 wherein the moving electrodes include moving electrodes connected to and extending from opposite sides of the relatively rigid member.

7. The MEMS switch of claim 6 wherein the spring includes a plurality of resilient members connected to and extending from opposite sides of the relatively rigid member.

8. The MEMS switch of claim 1 wherein the fixed electrodes and moving electrodes have major surfaces facing one another.

9. The MEMS switch of claim 1 wherein the spring includes:
   a relatively rigid member connected to the contact shuttle and movable in the linear path; and
   at least two resilient members connected to and extending from the rigid member.

10. The MEMS switch of claim 9 wherein the resilient members are parallel to the plane of the substrate.

11. The MEMS switch of claim 10 wherein the moving electrodes are connected to and extend from opposite sides of the rigid member.

12. The MEMS switch of claim 11 wherein the moving electrodes include at least two electrodes on both opposite sides of the rigid member.

13. The MEMS switch of claim 12 wherein the spring is a parallelogram structure.

14. The MEMS switch of claim 1 wherein the spring is parallelogram structure including:
   a relatively rigid member connected to the contact shuttle and movable in the linear path;
   first and second end members extending from the rigid member at spaced-apart locations;
   a first side member connected to and extending between the first and second end members on a first side of the rigid member;
   a second side member connected to and extending between the first and second end members on a second side of the rigid member;

a first support arm having a first end connected to the first side member and a second end connected to the substrate; and a second support arm having a first end connected to the second side member and a second end connected to the substrate.

15. The MEMS switch of claim 14 wherein:

the second end of the first support arm is located between the rigid member and the first side member; and the second end of the second support arm is located between the rigid member and the second side member.

16. The MEMS switch of claim 1 wherein the first and the second switch contacts are positioned adjacent to but are electrically isolated from one another to form a concave gap that opens toward the contract shuttle.

17. The MEMS switch of claim 16 wherein the contact shuttle is a convex member that is sized and shaped to extend into the concave gap between the first and the second switch contacts.

18. The MEMS switch of claim 16 wherein the first and the second switch contacts have planar faces to form a V-shaped gap that opens toward the contract shuttle.

19. The MEMS switch of claim 18 wherein the contact shuttle is a triangularly-shaped member that is sized and shaped to extend into the V-shaped gap between the first and the second switch contacts.

20. A MEMS switch, including:

a substrate;

a contact shuttle movable with respect to the substrate between switch state positions;

a plurality of moving electrodes coupled to the contact shuttle at spaced-apart locations and having generally planar major surfaces facing each other to form a comb structure; and a plurality of fixed electrodes coupled to the substrate at spaced-apart locations and having generally planar major surfaces facing each other to form a comb structure, the fixed electrode comb structure interleaved with the moving electrode comb structure, wherein in response to the application of an electric actuation voltage, electrostatic forces develop between the moving and fixed electrodes causing the major surfaces of the moving electrodes to move with respect to the major surfaces of the fixed electrodes, thereby forcing the contact shuttle to move between the switch state positions along a longitudinal axis parallel to the substrate and perpendicular to the planar major surfaces of the electrodes.

21. The MEMS switch of claim 20 and further including:

a member connected to the contact shuttle; and wherein the moving electrodes are mounted to the member.

22. A MEMS switch, including:

switch contacts;

a driven member;

a contact shuttle connected to the driven member and movable between switch state positions with respect to the switch contacts; and an isolation mount connecting the contact shuttle to the driven member, including;

a retainer member fixedly connected to the other of the contact shuttle and driven member; and an engaging member fixedly connected to the other of the contact shuttle and driven member, the engaging member free from fixed connection to but retained by the retainer member, and wherein adjacent surfaces of the contact shuttle, retainer member and engaging member are coated with an oxide insulator.

23. The MEMS switch of claim 22 wherein the contact shuttle includes:

a polysilicon base;

a metal contact member on the base; and native oxide between the bast and metal contact member.

24. A MEMS switch comprising:

first and second switch contacts positioned adjacent to and electrically isolated from one another to form a concave gap;

a convex contact shuttle sized and shaped to extend into the concave gap and movable in a linear path between first and second switch state positions with respect to the switch contacts; and an electrostatic actuating mechanism for driving the contact shuttle between the first and the second switch state positions.

25. The MEMS switch of claim 24 wherein the first and the second switch contacts have planar faces to form a V-shaped gap that opens toward the contract shuttle.

26. The MEMS switch of claim 25 wherein the contact shuttle is a triangularly-shaped member that is sized and shaped to extend into the V-shaped gap between the first and the second switch contacts.

27. The MEMS switch of claim 24 wherein the contact shuttle includes:

a polysilicon base;

a metal contact member on the base; and native oxide between the base and metal contact member.

28. A MEMS actuator comprising:

a substrate defining a plane;

a plurality of moving electrodes having generally planar major surfaces perpendicular to the plane of the substrate;

a plurality of fixed electrodes, each located interleaved with and adjacent to one of the moving electrodes, having generally planar major surfaces perpendicular to the plane of the substrate, wherein in response to the application of an electric actuation voltage, electrostatic forces develop between the moving and fixed electrodes causing the moving electrodes to move along an axis parallel to the plane of the substrate and perpendicular to the planar major surfaces of the electrodes; and at least one spring for biasing the movable comb structure to a rest position upon removal of the electric actuation voltage.

* * * * *

UNITED STATES PATENT AND TRADEMARK OFFICE
CERTIFICATE OF CORRECTION

PATENT NO. : 6,798,315 B2
DATED : September 28, 2004
INVENTOR(S) : Timothy M. Schaefer It is certified that error appears in the above-identified patent and that said Letters Patent is hereby corrected as shown below:

<u>Column 9,</u>
Lines 15 and 22, delete "contract" and insert therefor -- contact --

<u>Column 10,</u>
Line 3, delete "the other" and insert therefor -- one --
Line 29, delete "contract" and insert therefor -- contact --

Signed and Sealed this

Eighteenth Day of January, 2005

JON W. DUDAS
*Director of the United States Patent and Trademark Office*